United States Patent
Lai et al.

(10) Patent No.: US 8,190,808 B2
(45) Date of Patent: May 29, 2012

(54) MEMORY DEVICE HAVING STAGGERED MEMORY OPERATIONS

(75) Inventors: Lawrence Lai, San Jose, CA (US); Wayne S. Richardson, Saratoga, CA (US); Chad A. Bellows, Burlingame, CA (US)

(73) Assignee: Rambus Inc., Sunnyvale, CA (US)

( * ) Notice: Subject to any disclaimer, the term of this patent is extended or adjusted under 35 U.S.C. 154(b) by 23 days.

(21) Appl. No.: 10/920,508

(22) Filed: Aug. 17, 2004

(65) Prior Publication Data

US 2006/0039227 A1 Feb. 23, 2006

(51) Int. Cl.
*G06F 12/00* (2006.01)
*G06F 13/00* (2006.01)
*G06F 13/28* (2006.01)

(52) U.S. Cl. .................... 711/5; 711/169; 365/230.03
(58) Field of Classification Search ............... 711/5, 169
See application file for complete search history.

(56) References Cited

U.S. PATENT DOCUMENTS

| | | |
|---|---|---|
| 4,377,855 A | 3/1983 | Lavi |
| 4,542,483 A | 9/1985 | Procyk |
| 4,569,036 A | 2/1986 | Fujii et al. |
| 4,636,982 A | 1/1987 | Takemae et al. |
| 4,646,268 A | 2/1987 | Kuno |
| 4,670,745 A | 6/1987 | O'Malley et al. |
| 4,698,788 A | 10/1987 | Flannagan et al. |
| 4,700,328 A | 10/1987 | Burghard |
| 4,710,902 A | 12/1987 | Pelley, III et al. |
| 4,740,921 A | 4/1988 | Lewandowski et al. |
| 4,758,993 A | 7/1988 | Takemae |
| 4,766,538 A | 8/1988 | Miyoshi |
| 4,768,157 A | 8/1988 | Chauvel et al. |
| 4,787,858 A | 11/1988 | Killian, Jr. |
| 4,796,230 A | 1/1989 | Young |
| 4,800,525 A | 1/1989 | Shah et al. |
| 4,811,302 A | 3/1989 | Koishi |
| 4,825,413 A | 4/1989 | Tran |
| 4,837,465 A | 6/1989 | Rubinstein |
| 4,837,743 A | 6/1989 | Chiu et al. |
| 4,843,264 A | 6/1989 | Galbraith |
| 4,862,421 A | 8/1989 | Tran |
| 4,888,732 A | 12/1989 | Inoue et al. |

(Continued)

FOREIGN PATENT DOCUMENTS

EP 1248267 A 10/2002

(Continued)

OTHER PUBLICATIONS

International Search Report and Written Opinion of the International Searching Authority in International Application PCT/US2005/032770, World Intellectual Property Organization, Jan. 26, 2006, 12 pgs.

(Continued)

*Primary Examiner* — Brian Peugh
*Assistant Examiner* — Prasith Thammavong

(57) ABSTRACT

A memory system includes logical banks divided into sub-banks or collections of sub-banks. The memory system responds to memory-access requests (e.g., read and write) directed to a given logical bank by sequentially accessing sub-banks or collections of sub-banks. Sequential access reduces the impact of power-supply spikes induced by memory operations, and thus facilitates improved system performance. Some embodiments of the memory system combine sequential sub-bank access with other performance-enhancing features, such as wider power buses or increased bypass capacitance, to further enhance performance.

29 Claims, 8 Drawing Sheets

U.S. PATENT DOCUMENTS

| | | | |
|---|---|---|---|
| 4,903,344 A | 2/1990 | Inoue | |
| 4,961,168 A | 10/1990 | Tran | |
| 4,972,373 A * | 11/1990 | Kim et al. | 365/203 |
| 4,982,370 A | 1/1991 | Matsumoto et al. | |
| 4,984,196 A | 1/1991 | Tran et al. | |
| 4,985,867 A | 1/1991 | Ishii et al. | |
| 4,991,141 A | 2/1991 | Tran | |
| 5,046,050 A | 9/1991 | Kertis | |
| 5,093,806 A | 3/1992 | Tran | |
| 5,111,434 A | 5/1992 | Cho | |
| 5,119,340 A | 6/1992 | Slemmer | |
| 5,121,358 A | 6/1992 | Slemmer et al. | |
| 5,124,610 A | 6/1992 | Conley et al. | |
| 5,124,951 A | 6/1992 | Slemmer | |
| 5,128,897 A | 7/1992 | McClure | |
| 5,132,931 A | 7/1992 | Koker | |
| 5,146,592 A | 9/1992 | Pfeiffer et al. | |
| 5,150,330 A | 9/1992 | Hag | |
| 5,181,205 A | 1/1993 | Kertis | |
| 5,193,072 A | 3/1993 | Frenkil et al. | |
| 5,193,074 A | 3/1993 | Anami | |
| 5,214,610 A | 5/1993 | Houston | |
| 5,222,047 A * | 6/1993 | Matsuda et al. | 365/230.03 |
| 5,241,503 A | 8/1993 | Cheng | |
| 5,249,165 A | 9/1993 | Toda | |
| 5,251,178 A | 10/1993 | Childers | |
| 5,263,002 A | 11/1993 | Suzuki et al. | |
| 5,267,215 A | 11/1993 | Tsujimoto | |
| 5,274,596 A | 12/1993 | Watanabe | |
| 5,291,444 A | 3/1994 | Scott et al. | |
| 5,301,162 A | 4/1994 | Shimizu | |
| 5,305,280 A | 4/1994 | Hayano | |
| 5,321,646 A | 6/1994 | Tomishima | |
| 5,337,283 A | 8/1994 | Ishikawa | |
| 5,343,438 A | 8/1994 | Choi et al. | |
| 5,383,159 A | 1/1995 | Kubota | |
| 5,390,308 A | 2/1995 | Ware et al. | |
| 5,394,528 A | 2/1995 | Kobayashi et al. | |
| 5,406,526 A | 4/1995 | Sugibayashi et al. | |
| 5,414,662 A | 5/1995 | Foss et al. | |
| 5,418,737 A | 5/1995 | Tran | |
| 5,428,389 A | 6/1995 | Ito et al. | |
| 5,455,802 A | 10/1995 | McClure | |
| 5,471,425 A | 11/1995 | Yumitori et al. | |
| 5,485,430 A | 1/1996 | McClure | |
| 5,517,456 A | 5/1996 | Chishiki | |
| 5,530,814 A | 6/1996 | Wong et al. | |
| 5,546,346 A | 8/1996 | Agata et al. | |
| 5,559,970 A | 9/1996 | Sharma | |
| 5,587,960 A | 12/1996 | Ferris | |
| 5,614,855 A | 3/1997 | Lee et al. | |
| 5,652,870 A | 7/1997 | Yamasaki et al. | |
| 5,655,113 A | 8/1997 | Leung et al. | |
| 5,717,871 A | 2/1998 | Hsieh et al. | |
| 5,717,901 A | 2/1998 | Sung et al. | |
| 5,748,561 A | 5/1998 | Hotta | |
| 5,751,657 A | 5/1998 | Hotta | |
| 5,787,267 A | 7/1998 | Leung et al. | |
| 5,793,998 A | 8/1998 | Copeland et al. | |
| 5,801,985 A | 9/1998 | Roohparvar et al. | |
| 5,852,725 A | 12/1998 | Yen | |
| 5,854,767 A * | 12/1998 | Nishi et al. | 365/219 |
| 5,893,927 A | 4/1999 | Hovis | |
| 5,903,509 A * | 5/1999 | Ryan et al. | 365/230.03 |
| 5,933,387 A | 8/1999 | Worley | |
| 5,936,885 A | 8/1999 | Morita et al. | |
| 5,958,033 A | 9/1999 | Schubert et al. | |
| 5,978,302 A * | 11/1999 | Merritt | 365/230.03 |
| 6,034,878 A | 3/2000 | Osaka et al. | |
| 6,047,347 A | 4/2000 | Hansen et al. | |
| 6,055,202 A * | 4/2000 | Merritt | 365/230.03 |
| 6,075,728 A | 6/2000 | Inoue et al. | |
| 6,125,157 A | 9/2000 | Donnelly et al. | |
| 6,138,185 A | 10/2000 | Nelson et al. | |
| 6,141,273 A | 10/2000 | Ku et al. | |
| 6,144,220 A | 11/2000 | Young | |
| 6,226,723 B1 * | 5/2001 | Gustavson et al. | 711/170 |
| 6,233,196 B1 * | 5/2001 | Lee | 365/230.03 |
| 6,240,039 B1 | 5/2001 | Lee et al. | |
| 6,247,084 B1 | 6/2001 | Apostol et al. | |
| RE37,409 E | 10/2001 | Barth et al. | |
| 6,311,313 B1 | 10/2001 | Camporese et al. | |
| 6,366,995 B1 | 4/2002 | Vilkov et al. | |
| 6,393,543 B1 | 5/2002 | Vilkov et al. | |
| 6,625,687 B1 | 9/2003 | Halbert et al. | |
| 6,754,120 B1 | 6/2004 | Bellows et al. | |
| 6,791,367 B2 * | 9/2004 | Terzioglu et al. | 327/38 |
| 6,825,841 B2 | 11/2004 | Hampel et al. | |
| 7,281,079 B2 | 10/2007 | Bains et al. | |
| 2001/0037428 A1 | 11/2001 | Hsu et al. | |
| 2002/0078294 A1* | 6/2002 | Tsuchida et al. | 711/105 |
| 2003/0052885 A1 | 3/2003 | Hampel et al. | |
| 2003/0174573 A1 | 9/2003 | Suzuki et al. | |
| 2004/0019756 A1 | 1/2004 | Perego et al. | |
| 2004/0120197 A1 | 6/2004 | Kondo et al. | |
| 2004/0177210 A1* | 9/2004 | Choi | 711/5 |

FOREIGN PATENT DOCUMENTS

| | | |
|---|---|---|
| EP | 0887737 B1 | 1/2003 |
| GB | 2367400 A | 4/2002 |
| WO | WO 91/16680 A1 | 10/1991 |

OTHER PUBLICATIONS

Hirose, et al., "A 20-ns 4-Mb COMOS SRAM with Hierarchical Word Decoding Architecture", IEEE, Oct. 1990, pp. 1068-1072, vol. 25, No. 5.

Koike, et al., "SP23.1: A 60ns 1Mb Nonvolatile Ferroelectric Memory with Non-Driven Cell Plate Line Write/Read Scheme", ISSCC, Feb. 1996, pp. 368-379/475.

Giacalone, et al., "SP23.2: A 1MB, 100MHz Integrated L2 Cache Memory with 128b Interface and ECC Protection", ISSCC, Feb. 1996, pp. 370-371/475.

Nitta, et al., "SP23.5: A 1.6FB/s Data-Rate 1Gb Synchronous DRAM w/ Hierarchical square-Shaped Memory Block & Distributed Bank Architecture", ISSCC, Feb. 1996, pp. 376-377/477.

Saeki, et al., "SP23.4: A 2.5ns Clock Access 250MHz 256Mb SDRAM with a Synchronous Mirror Delay", ISSCC, Feb. 1996, pp. 374-375/476.

Yoo, et al., "SP23.6: A 32-Bank 1Gb DRAM with 1GB/s Bandwidth", ISSCC,s Feb. 1996, pp. 378-379/477.

Aimoto, et al., "SP23.3: A 7I68GIPS 3.84GB/s 1W Parallel Image-Processing RAM Integrating a 16Mb DRAM and 128 Processors", ISSCC, Feb. 1996, pp. 372-373/476.

Sakata, et al., "Two-Dimensional Power-Line Selection Scheme for Low Subthreshold-Current Multi-Gigabit DRAM's", IEEE, Aug. 1994, pp. 887-894, vol. 29, No. 8.

Yoo, et al., "FA14.4: A 150MHz 8-Banks 256M Synchronous DRAM with Wave Pipelining Methods", ISSCC, Feb. 1995, pp. 250-251/374.

Nakamura, et al, "FA14.2: A 29ns 64Mb DRAM with Hierarchical Array Architecture", ISSCC, Feb. 1995, pp. 246-247/373.

Sugibayashi, et al., "WP3.5: A 30ns 256Mb DRAM with Multi-Divided Array Structure", ISSCC, Feb. 1993, pp. 50-51/262.

Sugibayashi, et al., "A 30-ns 256-Mb DRAM with a Multidivided Array Structure", IEEE, Nov. 1993, pp. 1092-1098, vol. 28, No. 11.

Konishi, et al., "Session SVIII: STATIC RAMs—FAM18.6: A 64Kb COMOS RAM", ISSCC, Feb. 1982, pp. 258-259/333.

Yoo, et al., "17.7: A 1.8V 700Mb/s/pin 512Mb DDR-II SDRAM with On-Die Termination and Off-Chip Driver Calibration", ISSCC, Feb. 2003, pp. 312-313/495/250-251.

Yamashita, et al., "FA15.2: A 3.84GIPS Integrated Memory Array Processor LSI with 64 Processing Elements and 3Mb SRAM", ISSCC, Feb. 1994, pp. 260-261/349.

Micron Graphics DDR3 DRAM. Advance 256Mb: x32 GDDR3 DRAM. © 2003 Micron Technology, Inc. pp. 1-67.

JEDEC, "Minutes of Meeting No. 71, JC-42.3 Committee on RAM Memories, including Proposal to Add Number of Banks Option to the Mode Register for 64M SDRAM," Joint Electron Device Engineering Council (JEDEC), May 25, 1994, New York, NY, pp. 1-14 plus 2-pg. Attachment T.

International Preliminary Report on Patentability and Written Opinion of the International Searching Authority in International Application PCT/US2005/028728, European Patent Office, Mar. 1, 2007, 5 pages.

International Search Report and Written Opinion of the International Searching Authority in International Application PCT/US2005/028728, World Intellectual Property Organization, Jan. 4, 2006.

C. Yoo et al., A 1.8V 700 Mb/s/pin 512Mb DDR-II SDRAM with On-Die Termination and Off-Chip Driver Calibration, IEEE International Solid-State Circuits Conference ISSCC 2003/Session 17/SRAM and DRAM/ Paper 17.7, pp. 312-313 and 496, plus Visuals Supplement on pp. 250-251 and 535.

F. Ware, "Direct RDRAM 256/288-Mbit (512kx16/18x32s)" Rambus, Preliminary Information, Document DL0060 Version0.9, Aug. 1999, pp. 1-66.

Fairchild Semiconductor, "Design Optimization Techniques for Double Data Rate SDRAM Modules," Jul. 2000. 6 pages.

Fujitsu Semiconductor, "Memory CMOS 8 X 256K X 32 Bit Double Data Rate FCRAM, MB81N643289-50/-60", Data Sheet, Advance Information, AE0.5E, pp. 1-56.

IEEE 100, "The Authoritative Dictionary of IEEE Standards Terms", Seventh Edition. Critical piece first to Cross bar switch (p. 252).

Kirihata et al., "A 390-mm2, 16-Bank, 1-Gb DDR SDRAM with Hybrid Bitline Architecture", IEEE Journal of Solid-State Circuits, vol. 34, No. 11, Nov. 1999; pp. 1580-1588.

Masumoto, "Configurable On-Chip RAM Incorporated Into High Speed Logic Array", Proceedings of the IEEE 1985 Custom Integratred Circuits Conference, May 20-23, 1985;.pp. 240-243.

Micron Technology, Inc., "Graphics DDR3 DRAM MT44H8M32—2 Meg x 32 x 4 Banks," Advance Data Sheet, Copyright 2003, pp. 1-67.

Micron Technology, Inc. "Synchronous DRAM", 1999, Preliminary 128 Mb: x4, x8, x16 SDRAM, pp. 1-53.

Micron Technology, Inc., "Micron Synchronous DRAM 128Mb:x32 SDRAM," pp. 1-52, Rev. Sep. 2000.

Minutes of Meeting No. 70, JC-42.3 Committee on RAM Memories, Mar. 9, 1994, Orlando, Florida, 72 pages (see, in particular, p. 62).

NVidia Corporation, "GeForce3: Lightspeed Memory Architecture," NVIDIA Corporation Technical Brief, pp. 1-9, date unknown.

S. Takase and N.i Kushiyama, "WP 24.1 A 1.6GB/s DRAM with Flexible Mapping Redundancy Technique and Additional Refresh Scheme," IEEE International Solid-State Circuits Conference, 4 pages plus ISSCC Slide Supplement pp. 348-349 and 506-507.

S. Takase and N.i Kushiyama, "WP 24.1 A 1.6GB/s DRAM with Flexible Mapping Redundancy Technique and Additional Refresh Scheme," IEEE Journal of Solid State Circuits, vol. 34, No. 11, Nov. 1999, pp. 1600-1606.

Samsung Electronics, "SDRAM Device Operations," 41 pages, date unknown.

Satoh et al., "A 209K-Transistor ECL Gate Array with RAM", IEEE Journal of Solid-State Circuits, vol. 24, No. 5, Oct. 1989; pp. 1275-1281.

Zhao et al., "An 18 Mb, 12.3 GB/s CMOS Pipeline-Burst Cache SRAM with 1.54 Gb/s/pin", IEEE International Solid-State Circuits Conference, 1999; 10 pages.

* cited by examiner

MEMORY DEVICE HAVING STAGGERED MEMORY OPERATIONS

BACKGROUND

FIG. 1 (prior art) shows a block diagram of a basic memory component 100, which includes a control interface 102 and a collection of four logical banks B0-B3 distributed among four quadrants 104. Each logical bank includes left and right sub-banks: for example, bank B0 includes a left sub-bank LB0 in the upper left quadrant and a right sub-bank RB0 in the lower right quadrant 104. As discussed in more detail below, physically separating banks reduces local power-supply fluctuations resulting from memory accesses, and consequently reduces deleterious noise and the resultant adverse impact on speed performance.

Each quadrant 104 includes a two-dimensional array of storage cells (not shown), a row/column address decoder 105, and sense amplifiers 106. Decoders 105 activate specified rows and access columns of the memory cells, while sense amplifiers 106 sense and temporarily store data extracted from a specified row in the associated banks or sub-banks. Data moved to or from the storage cells through a sense amplifier by an "activate" operation are available for access by read and write operations. Data is delivered to and extracted from memory component 100 via respective write pipes 107 and read pipes 108.

A "column" is the quanta of data accessed in a given row currently residing in the sense amplifier during a read or write operation. An external device, typically a memory controller, accesses the storage cells in one logical bank (e.g., sub-banks LB0 and RB0) by issuing an appropriate data-access request (read request or write request) to control interface 102, which in turn presents the appropriate address and control signals to the specified sub-banks via internal address and control buses 110.

FIG. 2A (prior art) illustrates the movement of data during three steps for accessing data in one of the logical banks introduced in FIG. 1. Step one is an activate operation in which data from a selected row in each of a corresponding pair of sub-banks are selected and placed into the associated sense amplifiers. Step two is a data-access (read or write) operation in which one column of the selected row (held in the sense amplifiers) is selected and accessed. Data from the sense amplifiers are transferred to read pipes 108 (read data), or data in write pipes 107 is transferred into the sense amplifiers. In FIG. 2A, the label "c" means "column."

Step three is a precharge operation. The sub-banks and sense amplifiers are deselected and left in a state in which another activate operation can access a different row. Prior to deselection, the data in the sense amplifiers, including any data modified by a write operation, are copied back to the storage cells of the selected row of the selected logical bank. In the present disclosure, an "operation" refers to memory operations, for example, one of the above mentioned steps (activate, read, write, precharge). A "transaction" specifies a sequence of one or more operations that accesses a memory component. The following examples assume that transactions are directed to precharged banks and that each transaction performs a precharge operation after each read or write operation.

FIG. 2B (prior art) is a timing diagram illustrating a read transaction directed to a precharged logical bank. A clock signal CLK is shown across the top of the diagram for reference. The "RQ" label identifies a collection of control/address signals that convey transaction requests to control interface 102, the label "DATA" identifies information conveyed to an external requestor, and the label "READ" identifies data conveyed to read pipes 108. The illustrative read transaction includes the following events:

1. At clock edge 0, interface 102 receives an ACT (activate) command specifying one row of a logical bank, logical bank B0 in this example. Via control buses 110, control interface 102 asserts a bit-sense signal BSen to specified logical bank B0, and thus opens one corresponding row in each sub-bank LB0 and RB0. Opening the rows requires power, and thus produces a power spike 210 on supply voltage Vdd. As shown in FIG. 1, each quadrant 104 is connected locally to supply voltage Vdd, and sub-banks are physically separated. The physical separation reduces the combined impact of accessing the sub-banks, but each quadrant 104 nevertheless suffers some supply-voltage degradation.

2. At clock edge 5, control interface 102 receives a read command RD for a given column of the now active logical bank B0. Control interface 102 responds by issuing a column-selection signal CSel via buses 110 to selected sub-columns within the selected sub-banks LB0 and RB0. Column accesses are power intensive, and thus produce another power spike 215. In this example, the column access causes 32 bits of read data RD from each sub-bank of the selected logical bank to be conveyed to read pipes 108. The two 32-bit data words from the read pipes together make up a single 64-bit data word DQ.

3. At clock edge 9, control interface 102 receives a PRE (precharge) command for the logical bank B0. Control interface 102 responds by issuing a precharge signal Pre via buses 110 to sub-banks LB0 and RB0 to deselect the logical banks in preparation for subsequent read and write transactions. The precharge operation once again draws supply power, and consequently produces yet another power spike 220. (The shapes and sizes of spikes 210, 215, and 220 are merely illustrative.)

Write transactions, similar to read transactions and producing similar power spikes, are well understood and are therefore omitted here for brevity.

Power-supply spikes of the type described above limit device performance. As noted above, the amplitude of such spikes is limited by dividing memory banks into widely separated sub-banks. Other approaches include the use of more and wider power buses and increased local bypass capacitance. Unfortunately, these approaches consume die area, and are thus undesirable.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In several embodiments of the present disclosure, memory device, apparatus, and methods of performing memory accesses in sequential fashion are described. For example, a memory access, such as one initiated in response to an activate command, a read command and/or a write command effectuates a divided or sequenced internal response. In an example of an activate command, received on the pins of the memory device, internal row activation and sensing is sequenced into two or more row sense operations. Here a delay time is inserted between row sense operations or the divided row operations can be timed using a clock signal (e.g., rising edges of the clock or both falling and rising edges of the clock signal). In the case of a read or write command, an internal prefetch of a plurality of data bits, based on a locality given by a column address, is staggered using delay circuitry or sequenced on consecutive timing events referenced by an external clock signal. One benefit of performing memory accesses in sequential fashion internally is that power spikes can be reduced. Another benefit of performing memory accesses in sequential fashion internally is that memory bandwidth may be increased.

Figure 3:
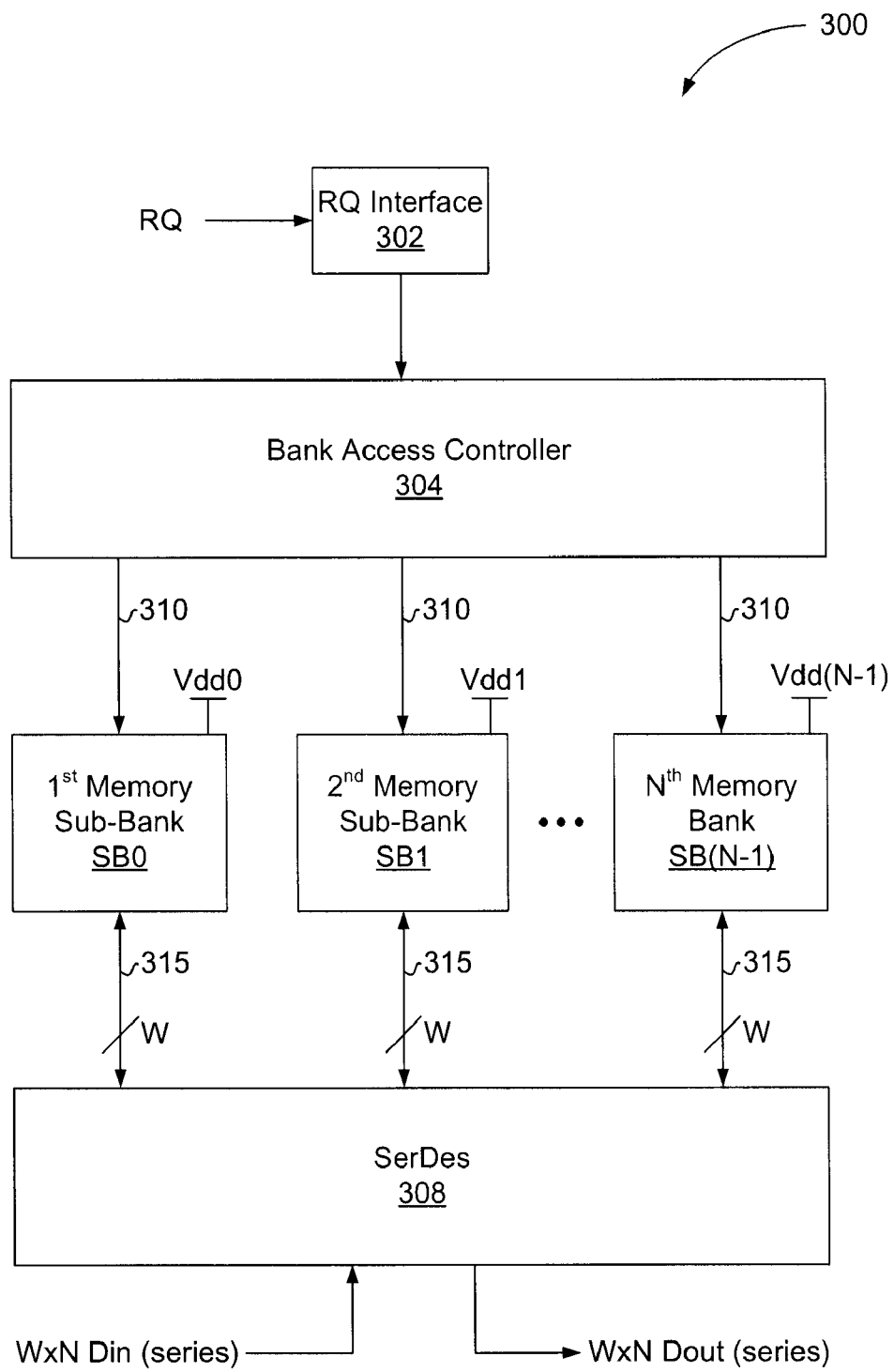
FIG. 3 depicts an integrated-circuit (IC) memory component 300 in accordance with one embodiment.

FIG. 3 depicts an integrated-circuit (IC) memory component 300 in accordance with one embodiment. One benefit realized in component 300 is that the impact of power-supply spikes induced by memory transactions can be reduced. To accomplish this reduction, component 300 sequentially accesses sub-banks of the core memory in response to memory access requests directed to a given bank. A memory access request may also be referred to as a command. The sequential core access offsets the memory operations in time, and in an embodiment, reduces the amplitude of the resulting power-supply spikes. In this embodiment, memory component 300 can thus be used at higher data rates without wider power buses or increased bypass capacitance. Other embodiments combine sequential sub-bank access with other performance-enhancing features, such as wider power buses or increased bypass capacitance, to further enhance performance.

Component 300 includes a request interface 302, a bank-access controller 304, N memory sub-banks SB[0:N−1], and a serializer/de-serializer (SerDes) 308. In the depicted embodiment, data Din is received as a series of W×N-bit data symbols, where N is the number of sub-banks and W is the width of each sub-bank. How many bits of data are provided in a given access to a particular sub-bank depends on the width. SerDes 308 divides these symbols into N sub-words, each of W bits. Bank access controller 304 then conveys access-control signals on access-control ports 310 to successive ones of memory banks SB[0:N−1] to sequentially store each sub-word into a corresponding one of the sub-banks.

Assuming, for example, that W is 128 and N is 2, data Din arrives in words of 128×2=256 bits. SerDes 308 divides received data into the two constituent sub-words, 128-bits each, and controller 304 issues the appropriate control signals to store the first sub-word into memory sub-bank SB0 and then the second sub-word into the second sub-bank SB1 via respective parallel data ports 315. In this embodiment, controller 304 offsets the storage operations used during the write transaction to offset the supply-voltage spikes caused by the sub-bank accesses, and thus reduces the amplitude of the resulting power-supply noise. Component 300 likewise offsets the operations used in read transactions to minimize power-supply noise. By reducing supply noise, component 300 supports higher data bandwidth and otherwise improves device performance; alternatively, the reduced impact on local supply voltages can be used to reduce supply line width, local bypass capacitance, or both, to save valuable die area. Conventional methods of reducing supply noise may be used in conjunction with sequential sub-bank access to further improve performance.

In various embodiments, circuits and methods described above in relation to the integrated circuit component 300 are applied to integrated circuit memory devices having a dynamic random access memory (DRAM) core such as Extreme Data Rate (XDR™) DRAM architecture, or Double Data Rate (DDR) Synchronous DRAM architecture. Other integrated circuit memory technologies are applicable to the apparatus and circuits described herein, for example, Flash memory device technology.

Figure 4A:
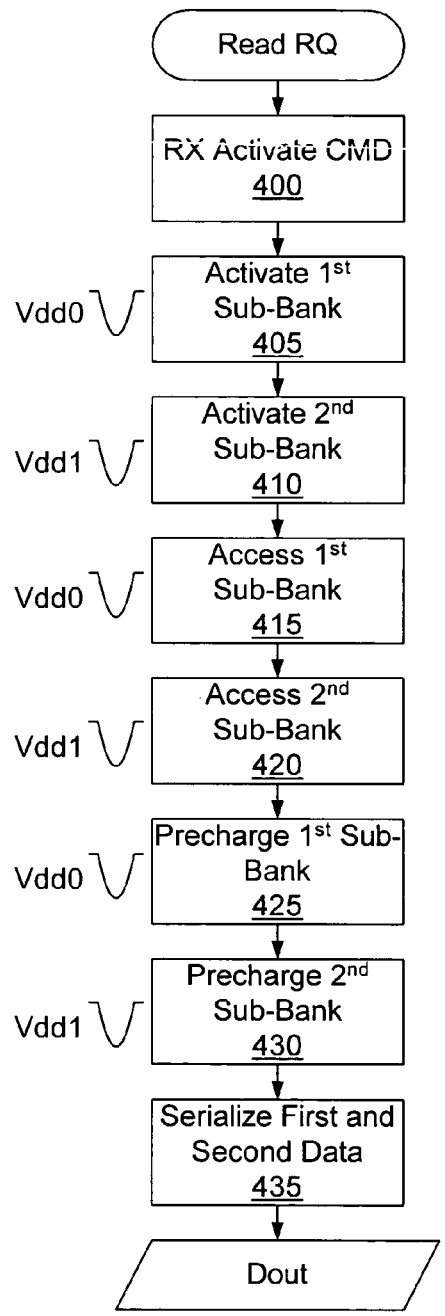
FIG. 4A describes a read transaction performed by component 300 of FIG. 3 in response to a read request received on lines RQ.
Figure 4B:
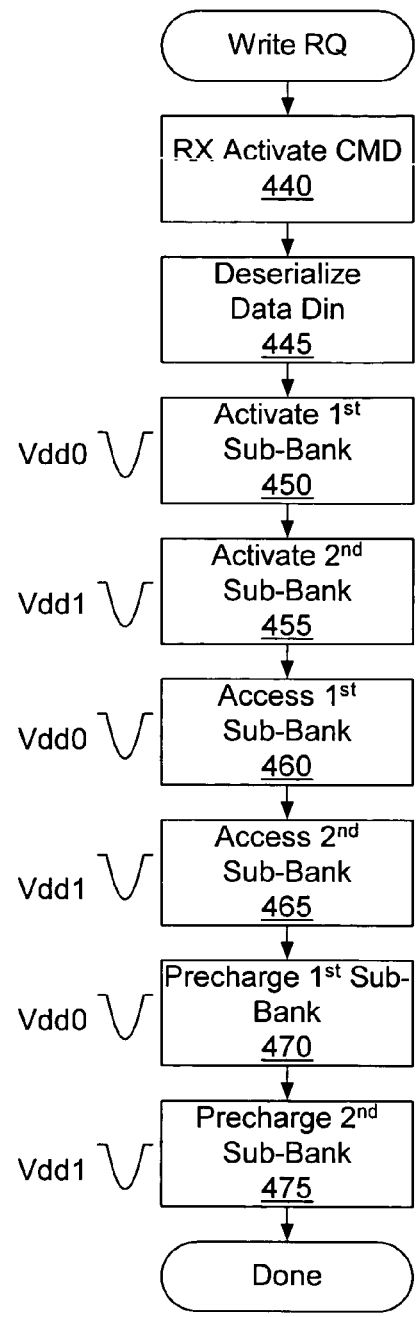
FIG. 4B depicts the response of component 300 of FIG. 3 to a write request on lines RQ.

FIG. 4A describes a read transaction performed by component 300 of FIG. 3 in response to a read request received on lines RQ. FIG. 4B describes a similar write transaction. Both examples assume only the first and second sub-banks SB0 and SB1 are accessed, but the sequence of operations can easily be extended to three or more sub-banks.

In FIG. 4A, at step 400, request interface 302 receives an activate command on request bus RQ and conveys a form of this command to bank access controller 304. Controller 304 activates first memory sub-bank SB0 by applying the appropriate signals on the leftmost access-control port 310 (step 405). This memory access draws supply current, so the voltage at local supply node Vdd0 (FIG. 3) drops slightly during step 405. Shortly after step 405, e.g. one memory clock cycle later, bank access controller 304 activates the second memory sub-bank SB1 (step 410), resulting in a supply spike at local supply node Vdd1. Sub-banks SB0 and SB1 are physically separated and their respective accesses are spread over time, both of which tend to reduce the overall amplitude of the supply noise. In other embodiments, bank access controller 304 activates the second memory sub-bank two or more clock cycles after step 405.

In another embodiment, bank access controller inserts a delay time to activate the second memory sub-bank SB1 (step 410). That is, respective accesses to sub-banks SB0 and SB1, that occur in response to an activate command, can be separated by a delay time. For example, accesses separated in time by a delay may be initiated by delaying an internal command using an inverter chain or by inserting resistive and capacitive elements to introduce a resistive capacitive time constant to the internal command.

Next, and still in response to the same read request, bank access controller 304 sequentially accesses first sub-bank SB0 (step 415) and second sub-bank SB1 (step 420). Access steps 415 and 420 once again impact local supply voltages Vdd0 and Vdd1, and are again separated in time to minimize the combined effects. Controller 304 then successively pre-charges sub-bank SB0 (step 425) and sub-bank SB1 (step 430), with the timing offset yet again minimizing the combined effects on the local supply voltages. At some point after access steps 415 and 420, SerDes 308 serializes the parallel data provided from first and second sub-banks SB0 and SB1 and conveys the resulting serialized data from memory component 300 on output port Dout (step 435). Alternative embodiments employ parallel input data, output data, or both.

FIG. 4B depicts the response of component 300 to a write request on lines RQ. To begin with, interface 302 receives an activate command (step 440). SerDes 308 breaks a W×N-bit word to be written to memory into separate W-bit sub-words (step 445). Controller 304 then activates first sub-bank SB0 (step 450) and next activates second sub-bank SB1 (step 455) to sequentially prepare them to receive respective ones of the sub-words from SerDes 308. Controller 304 then issues access control signals to the first and second memory sub-banks to select the addressed columns in those sub-banks. These accesses are done sequentially, in steps 460 and 465, to reduce the impact of the resulting power supply glitches. The sequential accesses, such as the ones performed in steps 460 and 465, can also be performed to achieve other benefits, for example; internal read and/or write pipeline resources may be reduced by multiplexing sequential accesses in time. Internal read/write pipelines refer to internal data paths, including associated circuitry, used to move data between the interface (e.g., interface circuitry coupled to terminals such as pins, balls, etc.) and the sense amplifiers. Finally, the first and second memory sub-banks are each pre-charged, again in sequence (steps 470 and 475) to complete the write cycle.

Figure 1:
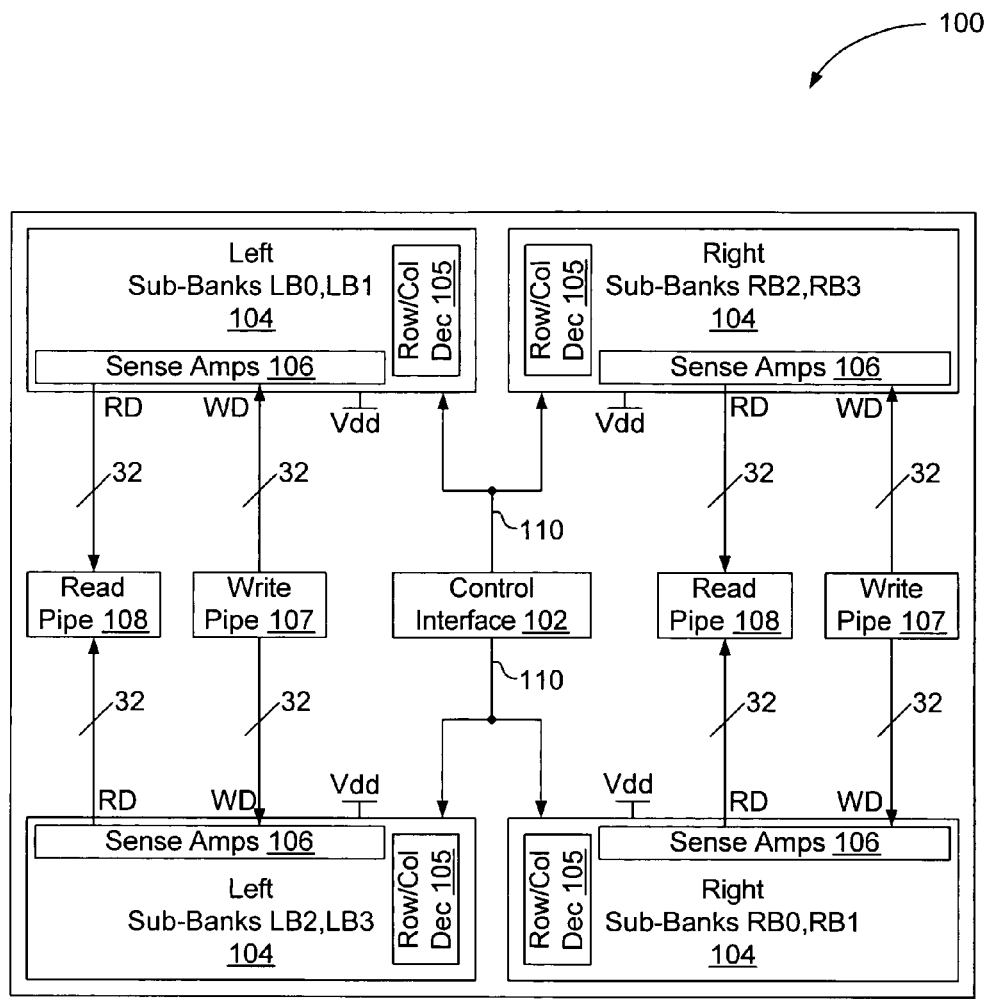
FIG. 1 (prior art) shows a block diagram of a basic memory component 100, which includes an control interface 102 and a collection of four logical banks B0-B3 distributed among four quadrants 104.
Figure 2A:
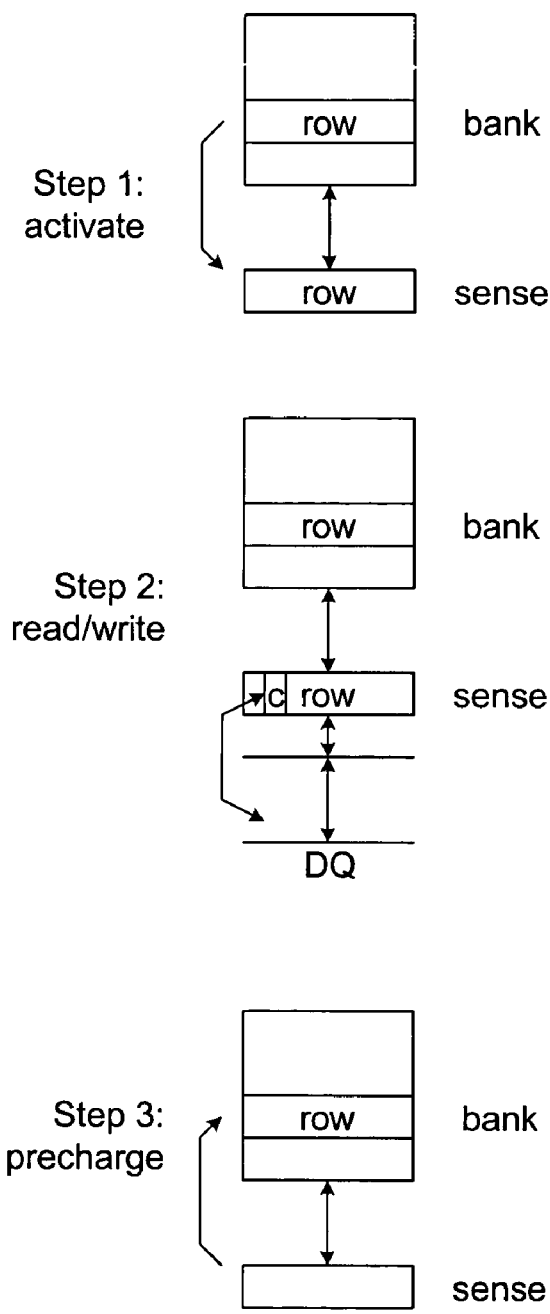
FIG. 2A (prior art) illustrates the movement of data during three steps for accessing data in one of the logical banks introduced in FIG. 1.
Figure 2B:
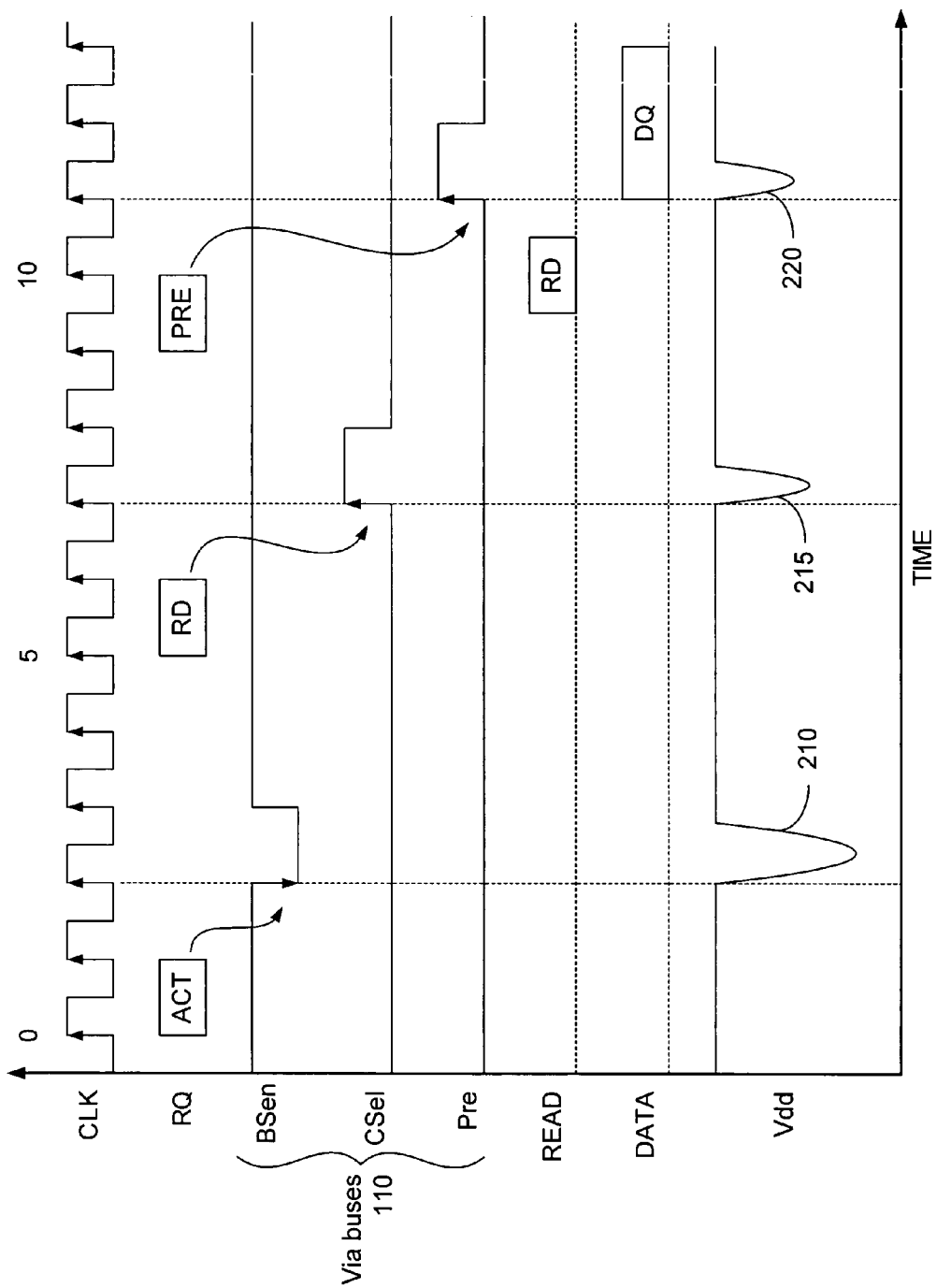
FIG. 2B (prior art) is a timing diagram illustrating a read transaction directed to a precharged logical bank.
Figure 5:
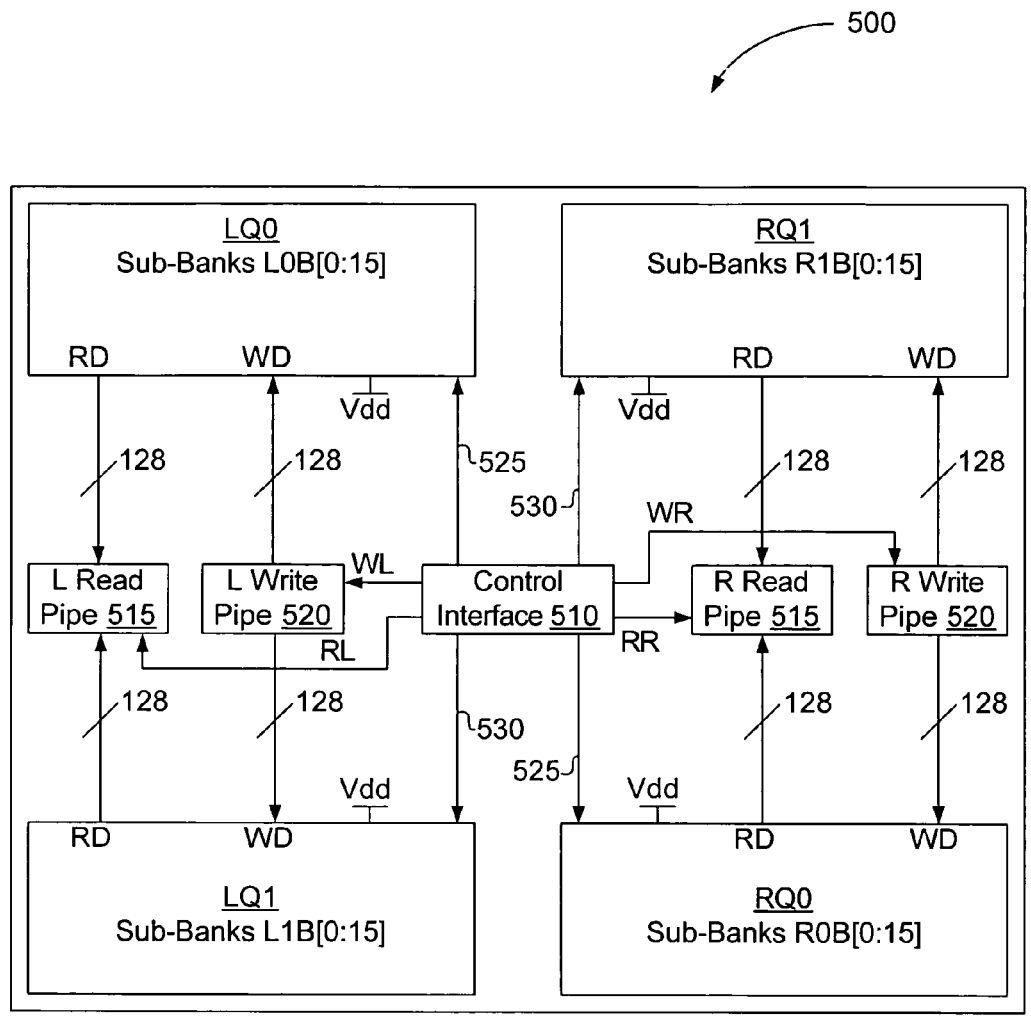
FIG. 5 depicts a memory component 500 in accordance with another embodiment.

FIG. 5 depicts a memory component 500 in accordance with another embodiment. Component 500 is similar to memory component 100 of FIG. 1, but is adapted in accordance with one embodiment to provide offset read and write access to the various sub-banks. The resulting reduction in the amplitude of power supply spikes allows for increased bandwidth and facilitates the extension of the core width of component 500 from 32 bits to 128 bits, where core width is a measure of the number of bits moved to or from memory component 500 in response to one write or read request.

Component 500 has, in this embodiment, four quadrants, one in each of the four corners. Each quadrant includes 16 discrete sub-banks. Sub-banks from all four quadrants are combined to reduce the amplitude of power-supply spikes resulting from memory operations. Each quadrant includes additional conventional memory circuitry, such as sense amplifiers, row decoders, and column decoders, but these are omitted here for ease of illustration. Memory control circuitry 510 provides timing and control signals to the four quadrants, left and right read pipes 515, and left and right write pipes 520.

Each read transaction produces two successive 256-bit collections of data, for a total of 512 bits of information. The first 256 bits produced in a read transaction are provided from corresponding sub-banks from quadrant LQ0 (for "left-quadrant zero") and quadrant RQ0 (for "right quadrant zero"), each of which provides 128 bits; the second 256 bits are similarly provided from quadrants LQ1 and RQ1. The circuitry that responds to the first half of each read request can be physically separated into opposite corners to reduce local supply spikes, while staggering the operations in time further reduces such spikes.

Figure 6:
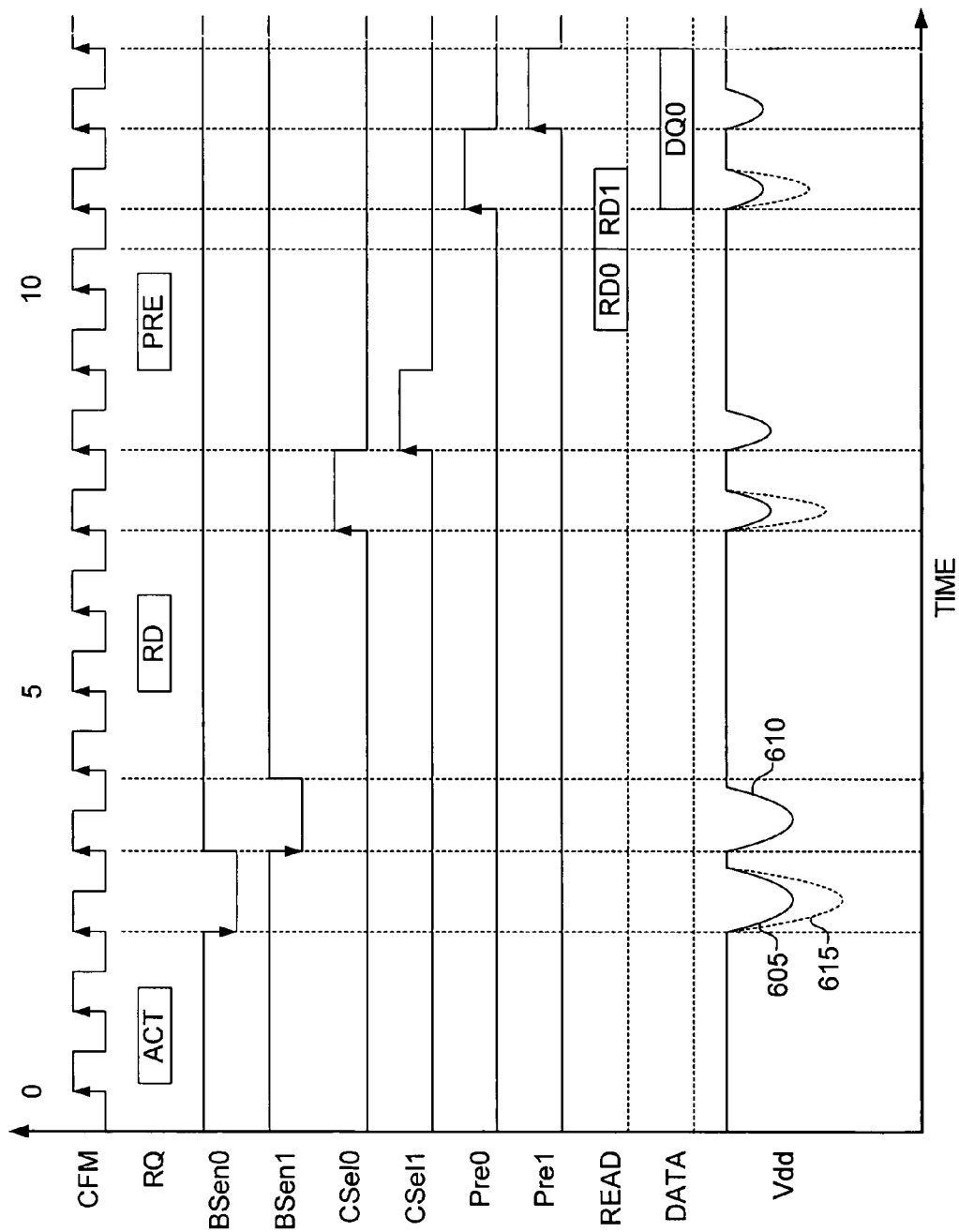
FIG. 6 is a timing diagram illustrating a read transaction directed to a pre-charged logical bank of component 500 (i.e., one sub-bank from each of the four quadrants) to retrieve 512 bits of information.

FIG. 6 is a timing diagram illustrating a read transaction directed to a pre-charged logical bank of component 500 (i.e., one sub-bank from each of the four quadrants) to retrieve 512 bits of information. A clock CLK is shown across the top of the diagram for reference. The RQ label identifies the transactional request conveyed to interface 510 and the label DATA provides information conveyed from left and right read pipes 515, collectively. The illustrative read transaction includes the following events and operations.

At clock edge 0, interface 510 receives an activate command ACT specifying one row of a logical bank. The present example assumes that the logical bank comprises sub-banks L0B[0], R0B[0], L1B[0], and R1B[0]. Interface 510 activates the row specified in the read request by issuing appropriate row-access control signals to the appropriate sub-banks. Among these signals, a bit-sense signal BSen0 to quadrants LQ0 and RQ0 on buses 525 activates the sense amplifiers of those quadrants, causing a Vdd spike 605. A number of clock cycles later, one clock cycle in this embodiment, interface 510 issues a second bit-sense signal BSen1 to quadrants LQ1 and RQ1 on buses 530 to activate the sense amplifiers of those quadrants, causing a second Vdd spike 610. A third spike 615 illustrates the theoretical combined impact of accessing all four quadrants simultaneously instead of offsetting the accesses in the manner described: the relatively lower amplitudes resulting from the offset memory operations reduce the amplitude of the maximum Vdd spikes.

The read and precharge operations are offset in the manner of the activate operation. Namely, interface 510 responds (1) to a read request RD with a column select command CSel0 to quadrants LQ0 and RQ0 and, a clock cycle later, with a second column select command CSel1 to quadrants LQ1 and RQ1; and (2) to a precharge request PRE with a precharge command Pre0 to quadrants LQ0 and RQ0 and, a clock cycle later, with a second precharge command Pre1 to quadrants LQ1 and RQ1. Supply voltage Vdd exhibits a pair of consecutive spikes for each of the read and precharge requests.

As a result of the single read operation, read pipes 515 together produce two 256-bit words separated by one clock cycle. A serializer (not shown) combines words RD0 and RD1 into a single, serial, 512-bit data word DQ0. In some embodiments, the serializer begins transmitting the first 256 bits of data DQ0 before the second 256 bits are available for transmit. Write transactions are accomplished in the same manner as read transactions, and the spacing of the precharge, activate, and sense operation similarly reduces the impact of write transactions on power supply voltage. Write transactions are therefore omitted here for brevity.

Component 500 separately controls sub-sets of each logical bank, and thus requires additional control lines as compared with conventional systems. Offsetting this increased overhead, read and write pipes 515 and 520 sequentially produce the output data over two clock cycles, and are thus only half the length of the output data.

Figure 7:
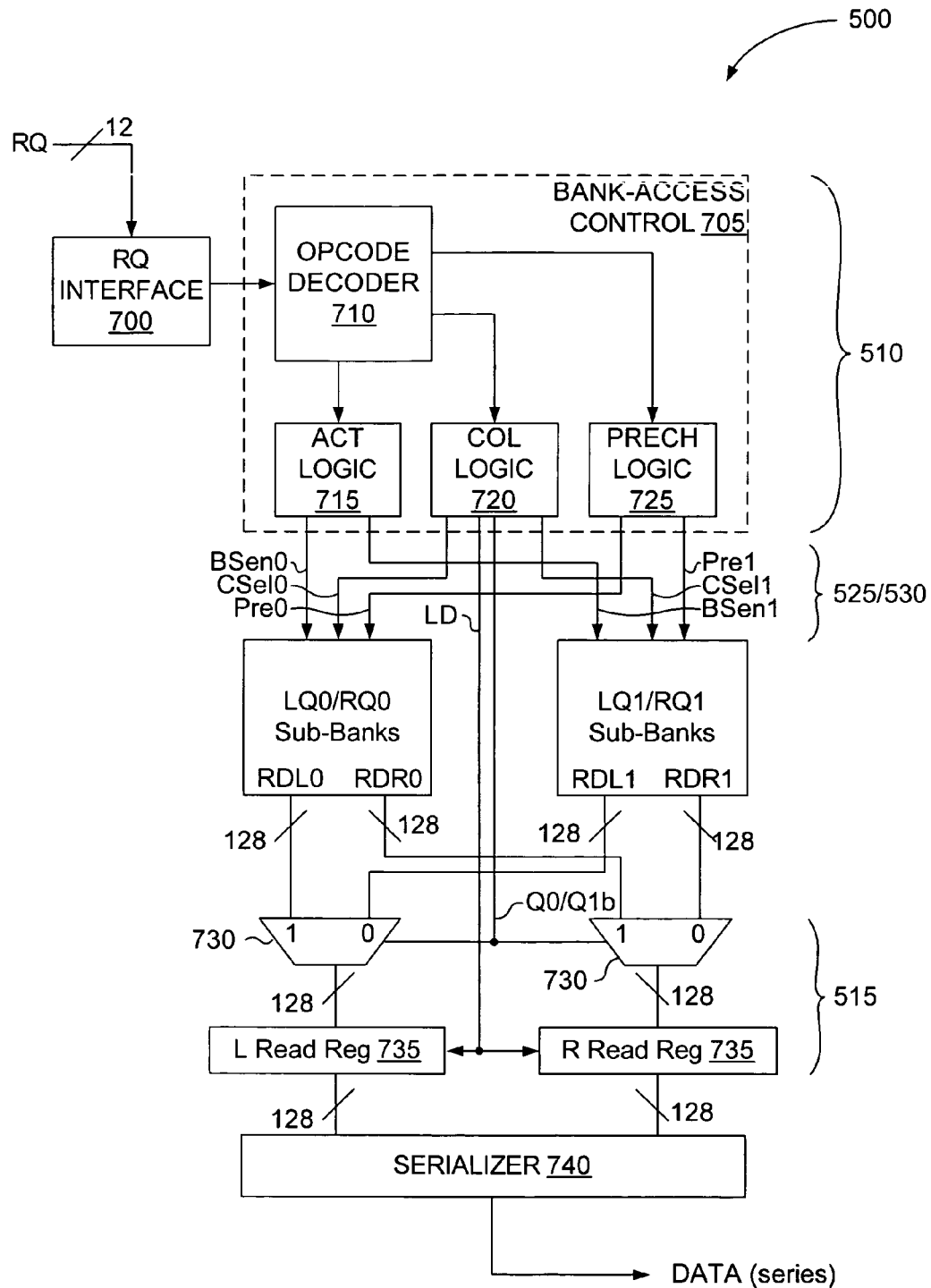
FIG. 7 is a functional block diagram of memory component 500 of FIG. 5. Interface 510 is broken into a request interface 700 and bank-access control logic 705.

FIG. 7 is a functional block diagram of memory component 500 of FIG. 5. Interface 510 is broken into a request interface 700 and bank-access control logic 705. Interface 700 receives requests RQ, for example, in the form of operation codes, or "op-codes," for control logic 705. The operation codes may be received sequentially or in parallel. Control logic 705 includes an op-code decoder 710 that decodes the op-codes and issues appropriate control signals to activation logic 715, column-select logic 720, and precharge logic 725. Decoder 710 additionally provides row and column addresses and other control signals well understood by those of skill in the art, but these are omitted here for brevity.

Activation logic 715, column logic 720, and precharge logic 725 issue respective bit-sense control signals BSen0, column select signals CSel0, and precharge signals Pre0 to sub-banks LQ0 and RQ0, depicted as one block, and issue respective bit-sense control signals BSen1, column select signals CSel1, and precharge signals Pre1 to sub-banks LQ1 and RQ1, also depicted as one block. As detailed above in connection with FIGS. 5 and 6, memory operations are performed sequentially, first on sub-banks LQ0 and RQ0 and then on sub-banks LQ1 and RQ1. Each of the control signals from bank-access control logic 705 is timed accordingly.

Read pipes 515 each include a multiplexer 730 feeding a 128-bit register 735. When transferring data from the sub-banks to read pipes 515, column logic 720 asserts a select signal on line Q0/Q1b, coupling the outputs of quadrants LQ0 and RQ0 to respective left and right registers 735, and asserts a load signal LD that latches the outputs of the selected quadrants into registers 735. Then, during the next clock cycle, column logic 720 de-asserts the select signal on line Q0/Q1b, coupling the outputs of quadrants LQ1 and RQ1 to respective left and right registers 735, and once again asserts load signal LD to latch the outputs of quadrants LQ1 and RQ1. 512 bits of data are thus presented to a serializer 740 over two clock cycles. Serializer 740 combines the two 256-bit sequences into 512-bit serial data. In some embodiments, serializer 740 transmits some or all of the first-received 256 bits before registers 715 are loaded with the second set of data provided in response to the single memory request. Serializer 740 may be integrated with or separated from component 500, and registers 735 can be part of serializer 740.

The concepts illustrated in FIG. 7 and the associated discussion can be extended to write and refresh transactions, as will be evident to those of skill in the art. A detailed discussion of write and refresh transactions is therefore omitted for brevity.

The foregoing embodiments reduce power-supply noise, and consequently facilitate core accesses that produce large numbers of bits. This advantage may be expected to grow in importance over time, as the speed performance of memory interfaces is increasing more rapidly than that of memory cores. Pipeline depths can thus be expected to deepen, with consequent increases in peak power, as larger chunks of data from the memory core are made available to support ever faster memory interfaces. The embodiments described herein can be used to bridge the widening performance gap between memory cores and memory interfaces.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Whether a given signal is an active low or an active high will be evident to those of skill in the art.

While the present invention has been described in connection with specific embodiments, variations of these embodiments will be obvious to those of ordinary skill in the art. For example, the IC memory components described herein can be collected on a common printed-circuit board to form a memory module, or can be integrated with other types of circuitry to form myriad computational systems, including e.g. graphics cards, set-top boxes, game consoles, line cards, and wireless phones. Moreover, the IC memory components need not be discrete memory ICs, but can instead be implemented and integrated with other types of circuitry, for example, in an embedded dynamic random access memory (DRAM) approach or in a system-on-chip (SOC) type of integrated circuit implementation. Embedded DRAM may be included with other circuits on an application specific integrated circuit (ASIC). Alternatively, multiple discrete integrated circuit memory devices, such as integrated circuit devices of the DRAM type, may be disposed in a single package using a multi-chip package (MCP) approach. Here the DRAM ICs are positioned within the package, either in a staked configuration or disposed on a two dimensional plane.

Some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An integrated circuit, comprising:
   first, second, third and fourth storage arrays, arranged in respective quadrants of the integrated circuit, the first and fourth storage arrays in diagonally-opposite quadrants and the second and third storage arrays in diagonally-opposite quadrants, each storage array serviced by a row decoder and a column decoder;
   a controller to provide in response to a single activation request (a) row access signals to the row decoder for the first storage array and to the row decoder for the fourth storage array, and (b) subsequently, to provide row access signals to the row decoder for the second storage array and to the row decoder for the third storage array, and to, subsequent to providing the row access signals, to provide in response to a single read request, column access signals to the column decoder for the first storage array and to the column decoder for the fourth storage array, and subsequently, (d) column access signals to the column decoder for the second storage array and to the column decoder for the third storage array; and
   a serializer to receive, corresponding to the row activation request and read request, first parallel data from the first and fourth storage arrays, and second parallel data from the third and second storage arrays, and to combine the first and second parallel data into a series of data for serial transmission.

2. The integrated circuit of claim 1, embodied as a dynamic random access memory (DRAM) integrated circuit, each of the first and second arrays comprising DRAM cells.

3. The integrated circuit of claim 2, where the controller issues precharge signals to the first and fourth arrays, and subsequently, issues precharge signals to the second and third arrays in response to a single precharge request.

4. The integrated circuit of claim 1, where the controller is to provide the row access signals for the first and fourth storage arrays at a first clock cycle, the row access signals for the second and third storage arrays at a second clock cycle, the column access signals for the first and fourth storage arrays at a third clock cycle, and the column access signals for the second and third column storage arrays at a fourth clock cycle.

5. The integrated circuit of claim 1, further comprising a first multiplexer to multiplex data transferred between the serializer and the first and third arrays, and a second multiplexer to multiplex data transferred between the serializer and the second and fourth arrays.

6. The integrated circuit of claim 1, further comprising a deserializer to separate serial input data into first, second, third and fourth write data, the first write data to be written to the first storage array, the second write data to be written to the second storage array, the third write data to be written to the third storage array and the fourth write data to be written to the fourth storage array.

7. The integrated circuit of claim 1, further comprising a memory request interface to receive memory-access requests from a memory controller integrated circuit.

8. The integrated circuit of claim 1, where the controller includes circuitry to issue read and write control signals to the first, second, third and fourth storage arrays.

9. The integrated circuit of claim 8, where the read and write control signals include column selection signals.

10. The integrated circuit of claim 1, where the integrated circuit utilizes a reference clock and where the integrated circuit is to output data in response to a read request at double data rate relative to the reference clock.

11. The integrated circuit of claim 1, where:
the integrated circuit comprises logical banks, each logical bank having an associated sub-bank in each of the four storage arrays;
the controller is, for access to any given logical bank, to sequentially provide respective row access signals to the row decoder for the associated sub-bank in the first storage array and to the row decoder for the associated sub-bank in the second storage array, and to sequentially provide respective row access signals to the row decoder for the associated sub-bank in the fourth storage array and to the row decoder for the associated sub-bank in the third storage array, from a single row activation request, and to, subsequent to providing the row access signals, to sequentially provide respective column access signals to the column decoder for the associated sub-bank in the first storage array and to the column decoder for the associated sub-bank in the second storage array, and to sequentially provide respective column access signals to the column decoder for associated sub-bank for the fourth storage array and to the column decoder for associated sub-bank in the third storage array, in response to a single read request; and
the serializer is to receive, corresponding to the row activation request and read request for the given logical bank, first parallel data from the associated sub-banks in the first and fourth storage arrays, and second parallel data from the associated sub-banks in the third and second storage arrays, and to combine the first and second parallel data into a series of data for serial transmission.

12. The integrated circuit of claim 11, where the logical banks number no less than four.

13. The integrated circuit of claim 11, where the logical banks number no less than sixteen.

14. The integrated circuit of claim 1, where the controller is to offset the respective row access signals to the row decoder for the first storage array and to the row decoder for the second storage array by an amount of time, and where the controller is to offset the respective row access signals to the row decoder for the fourth storage array and to the row decoder for the third storage array by an amount of time.

15. The integrated circuit of claim 14, where the amount of time used by the controller to offset the respective row access signals to the row decoder for the first storage array and to the row decoder for the second storage array is equal to one cycle of a reference clock for the integrated circuit, and where the amount of time used by the controller to offset the respective row access signals to the row decoder for the fourth storage array and to the row decoder for the third storage array is equal to one cycle of a reference clock for the integrated circuit.

16. A memory circuit, comprising:
a first logical memory bank divided into a plurality of arrays, including a first array, a second array, a third array and a fourth array, the first and fourth arrays physically-separated into diagonally-opposite quadrants of a memory core, and the second and third arrays physically-separated into diagonally-opposite quadrants of the memory core;
means for initiating activation, in response to a memory activation request having an associated row address, to (a) a first row in the first array and to a fourth row in the fourth array, and subsequently, to (b) a second row in the second array and to a third row in the third array;
means for initiating access, subsequent to sequentially initiating activation of the first, second, third and fourth rows and in response to a memory access request having an associated column address, to (a) first data in a first column of the first row and fourth data in a fourth column of the fourth row, and subsequently, to (b) second data in a second column of the second row and third data in a third column of the third row; and
means for converting the first, second, third and fourth data between a parallel format and a serial format, the means for converting to respectively exchange the first, second, third and fourth data (a) in parallel format with the respective arrays and (b) in a serial format with a data signaling path.

17. The memory circuit of claim 16, further comprising a first multiplexer to route data between the means for converting and a selective one of the first array or the third array, and a second multiplexer to route data between the means for converting and a selective one of the second array or the fourth array.

18. The memory circuit of claim 16, where the memory access request is a read request.

19. The memory circuit of claim 16, where the memory access request is a write request.

20. The memory circuit of claim 16, embodied as a dynamic random access memory in a multi-chip package.

21. The memory circuit of claim 16, further comprising means for sequentially precharging the first and second arrays subsequent to the memory access request.

22. An integrated circuit, comprising:
first, second, third, and fourth memory arrays presented as a single logical memory space arranged into respective physically-separated quadrants of the integrated circuit, the first and fourth memory arrays arranged in diagonally-opposite quadrants, and the second and third memory arrays arranged in diagonally-opposite quadrants;
first row decoder resources to service the first and fourth memory arrays, and second row decoder resources to service the second and third memory arrays;
first column decoder resources to service the first and fourth memory arrays, and second column decoder resources to service the second and third memory arrays;
a controller to retrieve data from each of the memory arrays responsive to a common memory read transaction, using row access signals provided to the respective row decoder resources, and subsequently, using column access signals provided to the respective column decoder resources; and
a serializer to load data in parallel from the first and fourth memory arrays, and subsequently, to load data in parallel from the second and third memory arrays, for serial transmission of data corresponding to the common memory read transaction from all four memory arrays as part of an uninterrupted series of data.

23. The integrated circuit of claim 22, further comprising:
a first multiplexer to supply data to the serializer from a selective one of the first or third memory arrays; and
a second multiplexer to supply data to the serializer from a selective one of the second or fourth memory arrays.

24. The integrated circuit of claim 23, further comprising a read pipe and a write pipe coupled to the first and second multiplexers to perform serial-parallel conversion and to exchange data in parallel with two of the four memory arrays at a time.

25. The integrated circuit of claim 24, where the controller issues precharge signals, subsequent to the column access signals, to the first and fourth memory arrays and then subsequently, to the second and third memory arrays.

26. A method of reading data from an integrated-circuit memory having first, second, third and fourth memory arrays, arranged in physically-separated quadrants of the integrated-circuit memory, the first and fourth memory arrays arranged in diagonally-opposite quadrants and the second and third memory arrays arranged as diagonally-opposite quadrants, the method comprising:
issuing row activation signals to the first and fourth memory arrays, and subsequent to issuing row activation signals to the first and fourth memory arrays, issuing row activation signals to the second and third memory arrays, to activate respective rows;
issuing, subsequent to issuing the row activation signals and in response to a read request, column access signals to the first and fourth memory arrays and, subsequent to issuing the column access signals to the first and fourth memory arrays, issuing column access signals to the second and third memory arrays, to read data from respective columns;
outputting a series of data, where the series includes data read from each of memory arrays in response to the read request.

27. The method of claim 26, further comprising issuing, subsequent to issuing the column access signals, precharge signals to the first and fourth memory arrays, and subsequent to issuing the precharge signals to the first and fourth memory arrays, issuing precharge signals to the second and third memory arrays.

28. A memory apparatus, comprising:
four memory arrays serviced by respective row decoders and by respective column decoders, each of the four memory arrays arranged into a respective physically separated quadrant of the memory apparatus;
an access controller to receive a single activation request and, responsive to the activation request, to transmit row access commands to a first pair of the memory arrays in diagonally-opposite quadrants and, subsequently, row access commands to a second pair of the memory arrays in the other diagonally-opposite quadrants, the access controller further to receive a single read request and, responsive to the read request, to transmit, subsequent to the row access commands, staggered column access commands to column decoders for the respective pairs of memory arrays; and
circuitry to combine data obtained from each of the memory arrays in response to the single read request into a series of data and to serially output the series of data.

29. The memory apparatus of claim 28, further comprising multiple logical banks, each having an associated sub-bank in a respective one of the four memory arrays, where the circuitry is adapted to combine a set of parallel data for a given logical bank from each associated sub-bank from the four memory arrays into a single series of data.

* * * * *